United States Patent
Azarnaminy et al.

(10) Patent No.: US 9,236,846 B2
(45) Date of Patent: Jan. 12, 2016

(54) TUNABLE BANDPASS FILTER DEVICE AND METHOD

(75) Inventors: Siamak Fouladi Azarnaminy, Waterloo (CA); Fengxi Huang, Waterloo (CA); Dong Yan, Nepean (CA); Raafat Mansour, Waterloo (CA)

(73) Assignee: Futurewei Technologies, Inc., Plano, TX (US)

(*) Notice: Subject to any disclaimer, the term of this patent is extended or adjusted under 35 U.S.C. 154(b) by 299 days.

(21) Appl. No.: 13/401,316

(22) Filed: Feb. 21, 2012

(65) Prior Publication Data

US 2013/0142089 A1 Jun. 6, 2013

Related U.S. Application Data

(60) Provisional application No. 61/567,506, filed on Dec. 6, 2011.

(51) Int. Cl.

| | |
|---|---|
| *H01P 1/205* | (2006.01) |
| *H01P 7/04* | (2006.01) |
| *H03H 7/01* | (2006.01) |
| *H01G 11/14* | (2013.01) |
| *H03H 7/00* | (2006.01) |

(52) U.S. Cl.
CPC ........... *H03H 7/0161* (2013.01); *H01P 1/2053* (2013.01); *H01P 7/04* (2013.01); *H01G 11/14* (2013.01); *H03H 2007/008* (2013.01); *Y10T 29/43* (2015.01)

(58) Field of Classification Search
CPC ............................. H01P 1/205; H01P 1/2053
USPC ......................................... 333/207, 226, 224
See application file for complete search history.

(56) References Cited

U.S. PATENT DOCUMENTS

| 4,100,504 | A * | 7/1978 | McGann .......................... 331/39 |
|---|---|---|---|
| 6,351,195 | B1 * | 2/2002 | Atokawa et al. .............. 333/134 |
| 6,781,476 | B2 * | 8/2004 | Tsunoda et al. .............. 333/110 |
| 7,352,264 | B2 * | 4/2008 | Schwab et al. ................ 333/203 |
| 2005/0012565 | A1 * | 1/2005 | Kamata et al. ................ 333/174 |
| 2005/0225411 | A1 * | 10/2005 | Sauder et al. ................. 333/202 |
| 2008/0024248 | A1 * | 1/2008 | Sieber et al. .................. 333/207 |
| 2009/0134960 | A1 * | 5/2009 | Larson et al. ................... 334/78 |

OTHER PUBLICATIONS

Fouladi, S., et al., "An Integrated Tunable Band-Pass Filter Using MEMS Parallel-Plate Variable Capacitors Implemented with 0.35μm CMOS Technology," Microwave Symposium, 2007, IEEE/MTT-S International, pp. 505-508.

(Continued)

*Primary Examiner* — Robert Pascal
*Assistant Examiner* — Gerald Stevens
(74) *Attorney, Agent, or Firm* — Slater & Matsil, LLP

(57) ABSTRACT

An embodiment radio frequency MicroElectroMechanical (RF-MEMS) tunable bandpass filter includes one or more tunable resonators, each of which includes an electrically reconfigurable capacitor bank, a tuning screw, and a resonating structure. In an embodiment, the capacitor bank includes fixed value capacitors and switches to vary the capacitance of the resonator. In an embodiment, the capacitor bank includes variable capacitors and direct current (DC) bias circuits to vary the capacitance of the resonator. The filter may be incorporated into a time division duplexing (TDD) base station or other wireless communications device.

20 Claims, 5 Drawing Sheets

(56) References Cited

OTHER PUBLICATIONS

Bakri-Kassem, M., et al., "Novel High-Q MEMS Curled-Plate Variable Capacitors Fabricated in 0.35-μm CMOS Technology," IEEE Transactions on Microwave Theory and Techniques, Feb. 2008, vol. 56, Issue 2, pp. 530-541.

Park, S.J., et al., "High-Q RF-MEMS Tunable Evanescent-Mode Cavity Filter," La Jolla, CA, IMS 2009 IEEE, pp. 1145-1148.

* cited by examiner

TUNABLE BANDPASS FILTER DEVICE AND METHOD

CROSS-REFERENCE TO RELATED APPLICATIONS

This application claims the benefit of U.S. Provisional Application No. 61/567,506, filed on Dec. 6, 2011, entitled Tunable Bandpass Filter Device and Method, which application is hereby incorporated herein by reference.

TECHNICAL FIELD

The present invention relates to a filter device and method, and, in particular embodiments, to a tunable bandpass filter device and method.

BACKGROUND

The wireless spectrum is heavily segmented. For a given frequency band, a wireless provider may only have 20 MHz of the frequency spectrum out of the whole band. Wireless base transceiver stations (BTSs) have filters to interface with the antenna. Filters in each BTS match with the frequency spectrum possessed by the wireless provider. Therefore many types of filters may be used in a given wireless service provider's network. Filters are large and heavy, however, accounting for approximately 20% of the BTS form factor. Furthermore, current base stations with fixed bandpass filters offer very limited upgradability once installed in the field.

Tunable filters can reduce the numbers of types filters used in a given network, and simplify logistic management. Tunable filter technology generally allows a base station to be reconfigured/upgraded after installation. Most tunable filters in BTSs use a mechanical motor to drive a tuning mechanism to change the filter's frequency. The mechanical motor and tuning mechanism increase filter size and may cause reliability issues.

SUMMARY

In an embodiment, a tunable bandpass filter is provided. The filter includes a tunable resonator including an electrically reconfigurable capacitor bank, a tuning screw, and a resonating structure. The filter also includes an input operably coupled to the tunable resonator and an output port operably coupled the tunable resonator.

In an embodiment, a tunable bandpass filter is provided. The filter includes a plurality of tunable resonators. Each of the tunable resonators includes an electrically reconfigurable capacitor bank, a tuning screw, and a resonating structure. The filter also includes a plurality of coupling structures to operably couple the tunable resonators together. The filter further includes an input port and an output port operably coupled to one or more of the plurality of the tunable resonators.

In an embodiment, a wireless communications device is provided. The device includes a duplexer operably coupled to an antenna, an amplifier operably coupled to the duplexer, and a tunable bandpass filter operably coupled to the duplexer and to the amplifier. The filter includes a tunable resonator having an electrically reconfigurable capacitor bank.

In an embodiment, a method of fabricating a tunable bandpass filter is provided. The method includes forming a tunable resonator with an electrically reconfigurable capacitor bank, a tuning screw, and a resonating structure. The method also includes operably coupling an input port and an output port to the resonator.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to a specific context, namely a wireless communications system that supports communications devices with data capability, i.e., third-generation (3G) and fourth-generation (4G) communications devices. The concepts of the present disclosure may also be applied, however, to wireless communications systems that support data capable communications devices in general.

Figure 1:
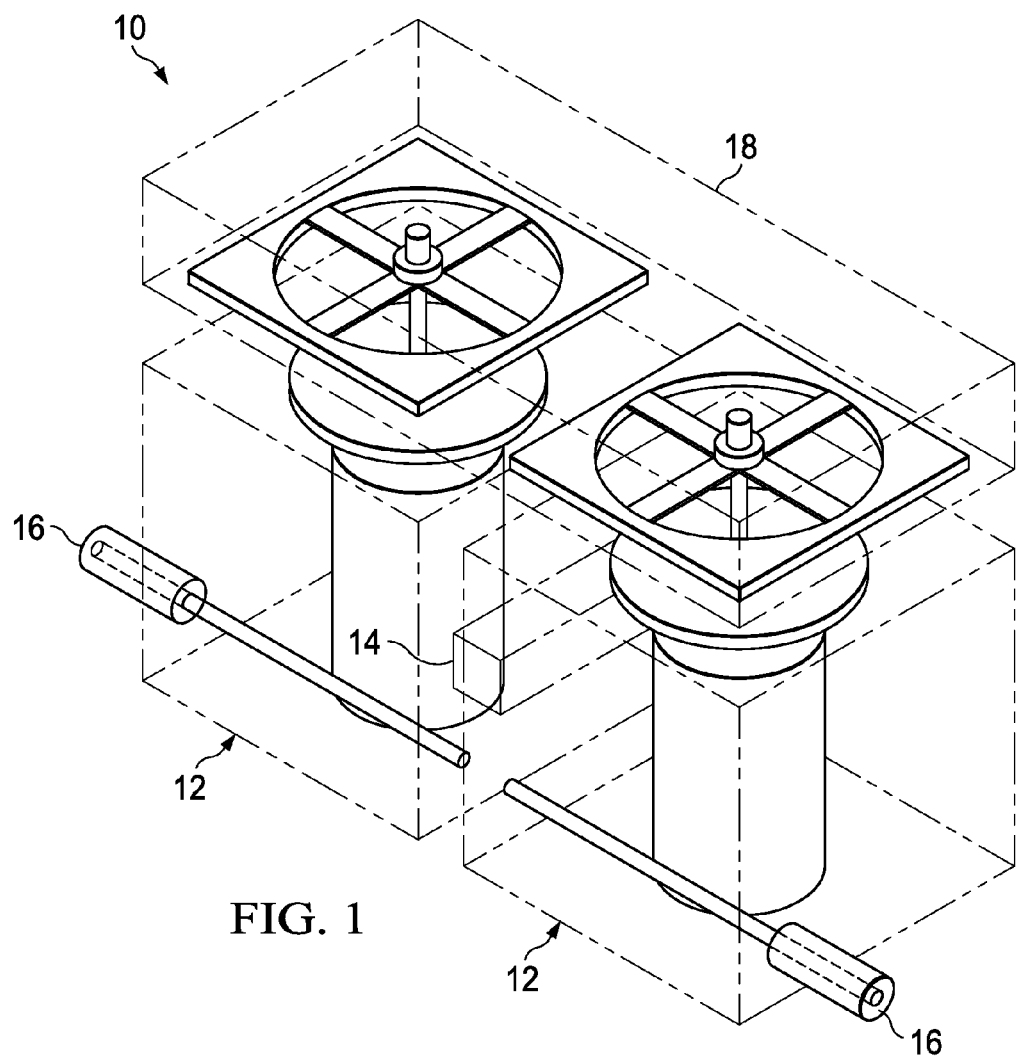
FIG. 1 is a perspective view of an embodiment of a tunable bandpass filter.

Referring now to FIG. 1, an embodiment of a tunable bandpass filter 10 (e.g., a radio frequency (RF) front end filter) is illustrated. Tunable filter technology is an integral part of wireless base station size and cost reduction. As will be more fully explained below, the filter 10 generally permits a wireless infrastructure provider to reduce the number of filter products being managed, with less logistic management complexity. The filter 10 also enables wireless service providers to reconfigure their networks through software upgrades, including remote software upgrades. In an embodiment, the filter 10 is smaller in size and weight than traditional tunable filters, yet provides increased tuning speed and reliability. In addition, the filter 10 is less expensive to produce and operate relative to conventional filters. The filter 10 is also applicable to a wide frequency range. Therefore, the filter 10 has worldwide application to many different wireless systems. An embodiment filter 10 has a center frequency with an over 70-mega Hertz (MHz) tuning range while the filter bandwidth remains constant across the entire tuning range.

As shown in FIG. 1, in an embodiment the filter 10 includes poles or tunable resonators 12, a coupling structure 14, and input/output ports 16. In FIG. 1, the filter 10 contains two of the tunable resonators 12. However, in other embodiments, the filter 10 may include more or fewer of the tunable resonators 12. Indeed, in an embodiment the filter 10 employs only a single tunable resonator 12 (which eliminates the need for the coupling structure 14). In other embodiments, the filter 10 may contain a plurality of the tunable resonators 12 (e.g., three, four, five, six, or more).

The coupling structure 14 permits the tunable resonators 12 to be operably coupled to each other. In an embodiment, the coupling structure 14 is a coupling iris having a length of about 24 mm and a height of about 6 mm. The input and output ports 16 permit the filter 10 to be incorporated into a wireless communication device (e.g., a time division duplexing (TDD) base station, another type of base station employing filters, etc.) or operably connected to other telecommunications devices. By way of example, the input port 16 may be coupled to an antenna and the output port may be coupled to a power amplifier. In an embodiment, the filter 10 includes a lid 18 disposed over the tunable resonators 12.

Figure 2:
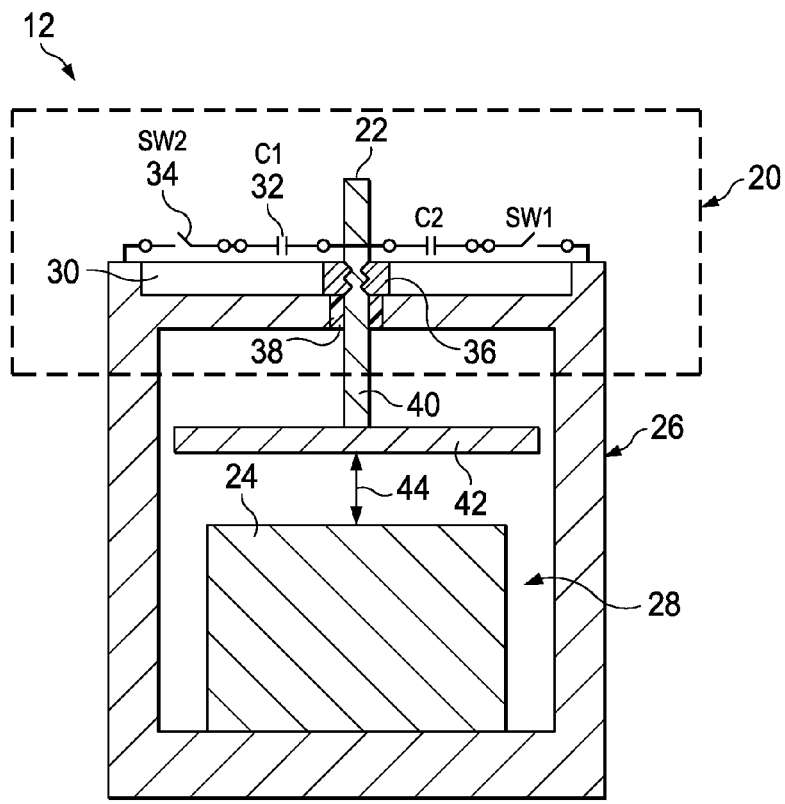
FIG. 2 is a cross section view of an embodiment of a tunable resonator employable in the filter of FIG. 1.

Referring now to FIG. 2, a cross section of one of the tunable resonators 12 from the filter 10 of FIG. 1 is illustrated. As shown, the tunable resonator 12 includes an electrically configurable capacitor bank 20, a tuning screw 22, and a resonating structure 24. In an embodiment the capacitor bank 20 may be supported by, or incorporated into, the lid 18 of the filter 10. In another embodiment, the capacitor bank 20 is generally supported by, or incorporated into, an upper portion of a body 26 of the tunable resonator 12.

The body 26 may be formed in a variety of shapes (e.g., rectangular, square, etc.) and from a variety of suitable materials such as, for example, copper. As shown, the body 26 of the tunable resonator 12 generally defines a metallic cavity 28. In an embodiment, the cavity 28 is three dimensional, which design enables high power operation for base stations, and has a height of approximately 30 mm, a width of approximately 30 mm, and a length of approximately 30 mm. In an embodiment, the body 26 of the tunable resonator 12, or some portion thereof, functions as a ground.

Still referring to FIG. 2, the capacitor bank 20 includes a printed circuit board (PCB) 30 configured to support and couple electronic components. In an embodiment, the capacitor bank 20 includes fixed value capacitors 32 and switches 34 mounted on, or operably coupled to, the PCB 30. In an embodiment, the capacitors 32 are high-Q ceramic capacitors and the switches 34 are radio frequency MicroElectroMechanical Systems (RF-MEMS) contact-type switches.

In an embodiment, the capacitor bank 20 is coupled to the tuning screw 22 by a PCB threaded insert 36 disposed above a Teflon spacer 38. The tuning screw 22 (i.e., tuning disk) includes a vertical portion 40 and a horizontal portion 42. As shown, the horizontal portion 42 extends down into the cavity 28 and is disposed above the resonating structure 24. A gap 44 is defined between a bottom surface of the horizontal portion 42 of the tuning screw 22 and an upper surface of the resonating structure 24. As will be more fully explained below, the capacitance of the resonator 12 generally correlates to the sum of the capacitances provided by the gap 44 and one or more of the capacitors 32. The variable capacitance of the capacitor bank 20 allows for continuously tunable operation.

In an embodiment, the tuning screw 22 may be manually rotated to drive the horizontal portion 42 upwardly to increase the size of the gap 44 or downwardly to decrease the size of the gap 44 in order to provide initial tuning of the filter 10. In another embodiment, the tuning screw 22 may be mechanically driven by, for example, a mechanical motor, to drive the horizontal portion 42 upwardly to increase the size of the gap 44 or downwardly to decrease the size of the gap 44 in order to provide initial tuning of the filter 10. In another embodiment, the tuning screw 22 may be both manually and mechanically rotated to alter the size of the gap 44.

In an embodiment, the resonating structure 24 is a metal cylinder having a height of approximately 21 mm and a radius of approximately 6 mm. In other embodiments, the resonating structure 24 may take other shapes and have other sizes in other embodiments. In an embodiment, the resonating structure 24 is formed from copper. The resonating structure 24 may be integrally formed with the body 26 of the resonator 12.

Figure 3:
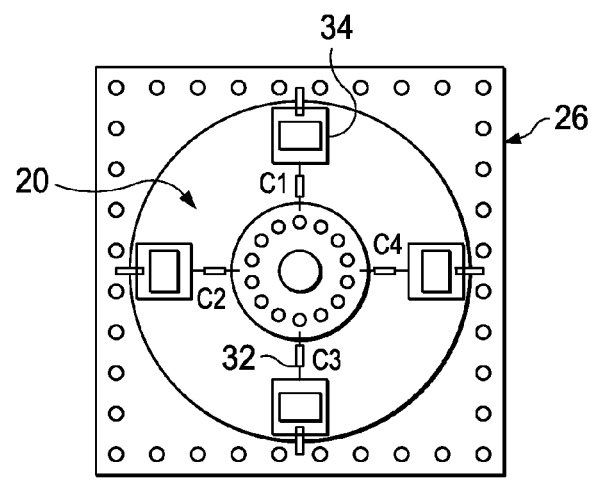
FIG. 3 is a top view of an embodiment of an electrically configurable capacitor bank in the tunable resonator of FIG. 2.
Figure 4:
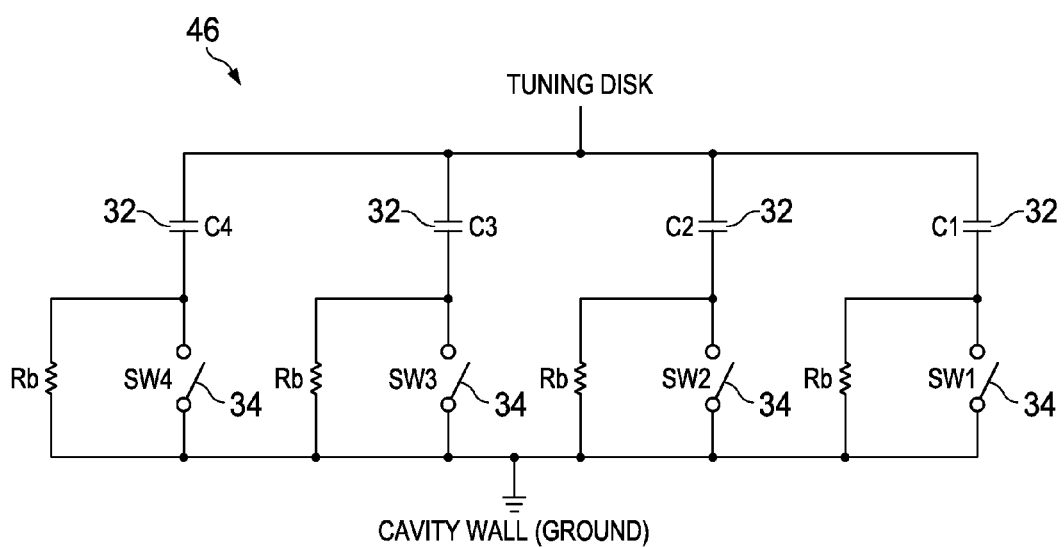
FIG. 4 is a circuit model for the electrically configurable capacitor bank of FIG. 3.

Referring now to FIG. 3, a top view of an embodiment of the capacitor bank 20 is illustrated. In FIG. 3, the capacitor bank 20 includes four RF-MEMS contact type switches 34 and four high-Q ceramic capacitors 32. An equivalent circuit model 46 for the capacitor bank 20 of FIG. 3 is depicted in FIG. 4. Using this circuit and configuration, the resonator 12 can be tuned to sixteen different states. In other words, the capacitor bank 20 is able to generate sixteen different capacitance values depending on the position of one or more of the switches 34. In other embodiments a different number of switches 34 and capacitors 32, either more or fewer, may be employed to allow tuning to more or fewer than sixteen states.

Figure 5:
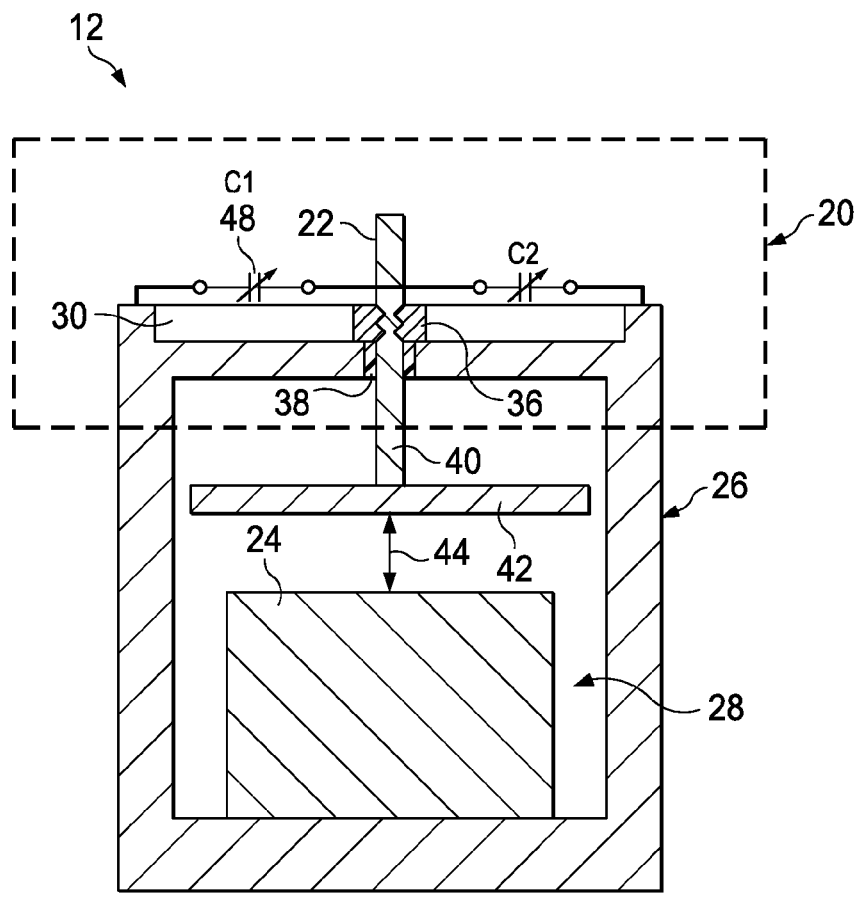
FIG. 5 is a cross section of another embodiment of a tunable resonator employable in the filter of FIG. 1.
Figure 6:
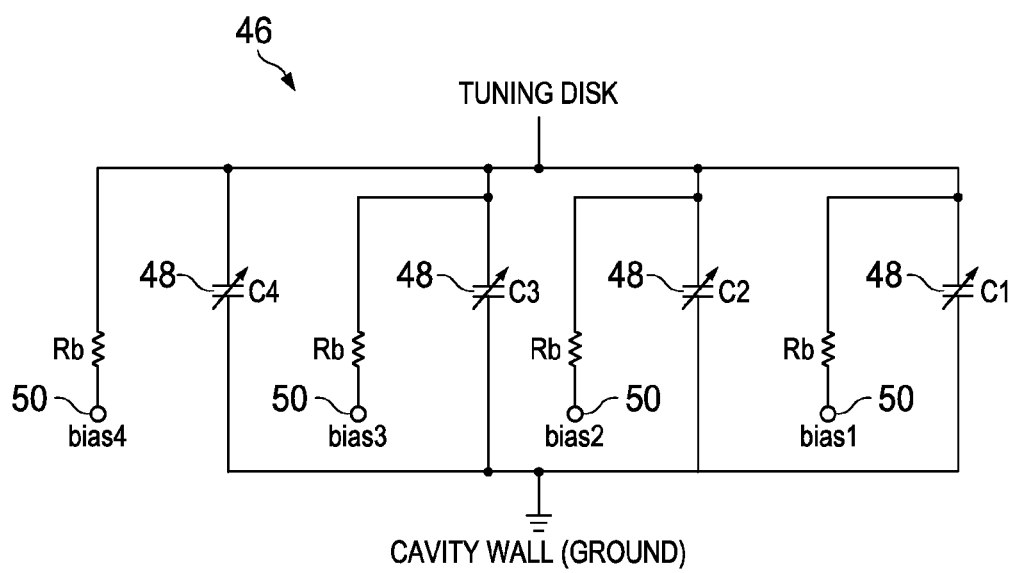
FIG. 6 is a circuit model for the electrically configurable capacitor bank of FIG. 5.

As collectively shown in FIGS. 5-6, another embodiment of a resonator 12 is illustrated. In this embodiment, the capacitor bank 20 of the resonator 12 employs tunable capacitors 48 (a.k.a., variable capacitors) operably coupled to direct current (DC) bias circuits 50 (as opposed to the fixed capacitors 32 and switches 34 of FIG. 1). In such an embodiment, each of the DC bias circuits 50 provides a controllable DC voltage to a corresponding tunable capacitor 48. That capacitor 48 produces a certain amount of capacitance based upon the voltage received. Therefore, by changing the controllable DC voltage the capacitance of each of the tunable capacitors 48 may be increased or decreased. In this manner, the tunable capacitors 48 may be intentionally and repeatedly adjusted to vary the amount of individual and total capacitance provided by the resonator 12. An equivalent circuit model 46 for the capacitor bank 20 of FIG. 5 is depicted in FIG. 6.

As proof of the concept, one of the resonators 12 was constructed. In that example, the resonator 12 was formed by machining copper (i.e., the resonator body 26 was copper). The inside surfaces of the cavity 28 were silver plated to provide a higher Q value. The capacitor bank 20 was mounted on the lid 18 of the resonator 12 and held in place with silver epoxy. The capacitor bank 20 included four high-Q multilayer capacitors from Johanson Technology, the values of which were $C_1$=0.2 picoFarad (pF), $C_2$=0.5 pF, $C_3$=0.6 pF, and $C_4$=0.7 pF. As used herein, high-Q generally indicates a Q value of greater than about 150 at 2.5 giga Hertz (GHz). The capacitor bank 20 also included four Radant single-pole, single-throw (SPST) RF-MEMS switches 34. Each switch 34 was actuated with a voltage of ninety volts (90V) and zero DC current (which accounts for close to zero power consumption). The measured tuning response of the resonator 12 is graphically illustrated in FIG. 7.

Figure 7:
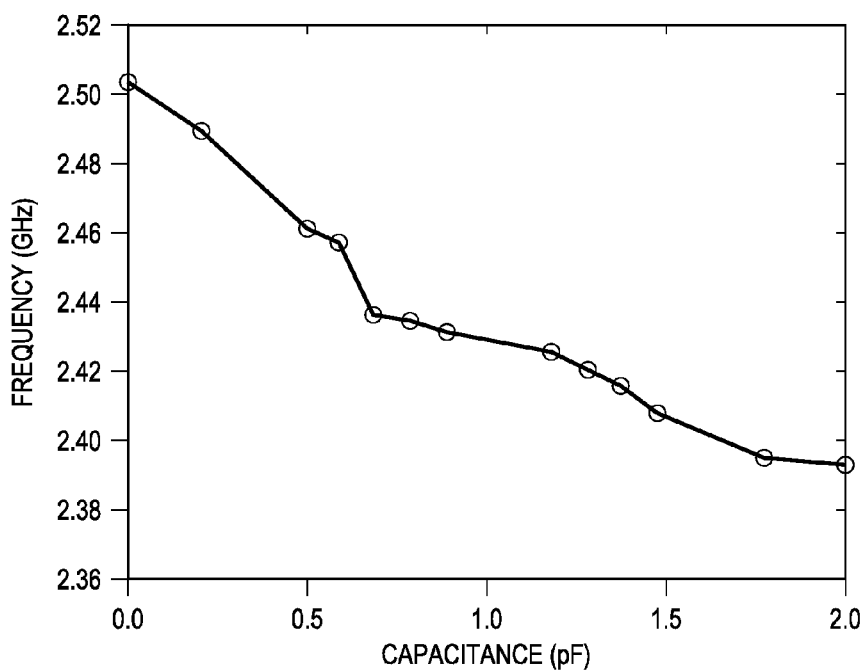
FIG. 7 is a graph illustrating a measured resonance frequency versus capacitance for an embodiment resonator.

As shown in the graph 52 of FIG. 7, the resonator 12 was tuned from about 2.503 GHz to about 2.393 GHz, which provided a tuning range of approximately 110 MHz. Over that tuning range, the measured Q value was from about 1301 to about 374.

Figure 8:
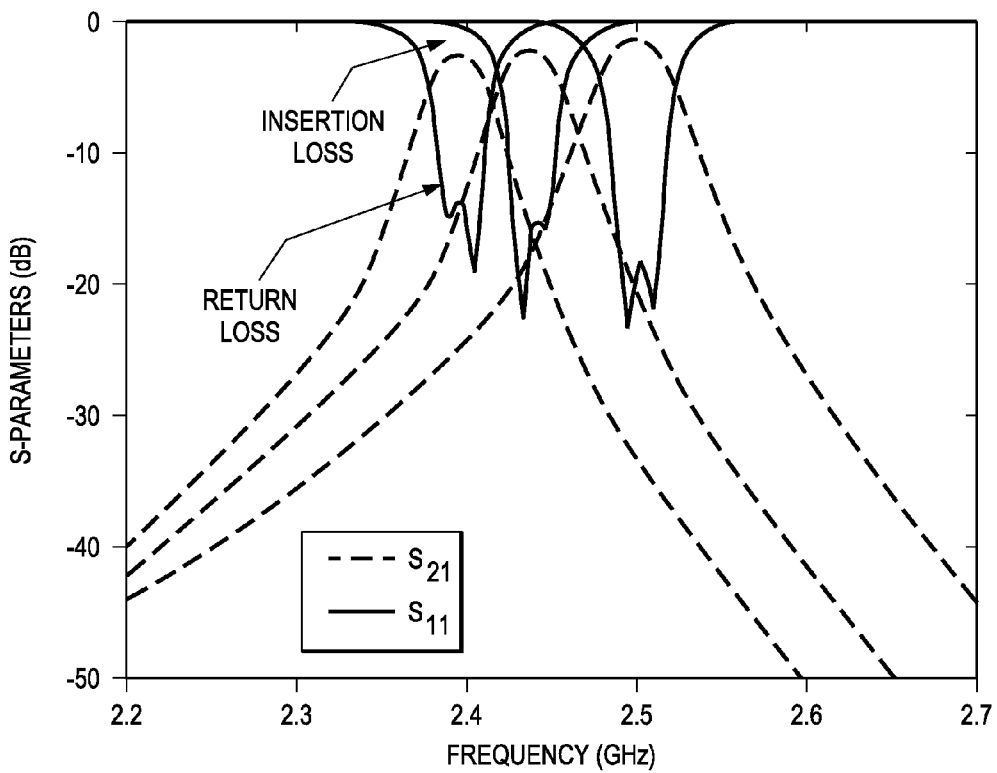
FIG. 8 is a graph illustrating a measured S-parameters for an embodiment two pole filter.

As further proof of the concept, one of the filters 10 was also constructed. In particular, a two-pole filter 10 was constructed using a pair of resonators 12 coupled as noted above. In this case, the resonators 12 were formed from an aluminum body 26 plated with copper. The measured tuning response of the filter 10 is graphically illustrated in FIG. 8. As shown in the graph 54 of FIG. 8, the filter 10 provided a tuning range of approximately 110 MHz from about 2.503 GHz to about 2.393 GHz. The return loss was greater than about 14 decibels (dB). The insertion loss, which is represented on the graph 54 by the distance between the 0-axis at the top of the graph and the peak of the largest of the three upwardly-extending waveforms, was about 1.32 dB.

Figure 9:
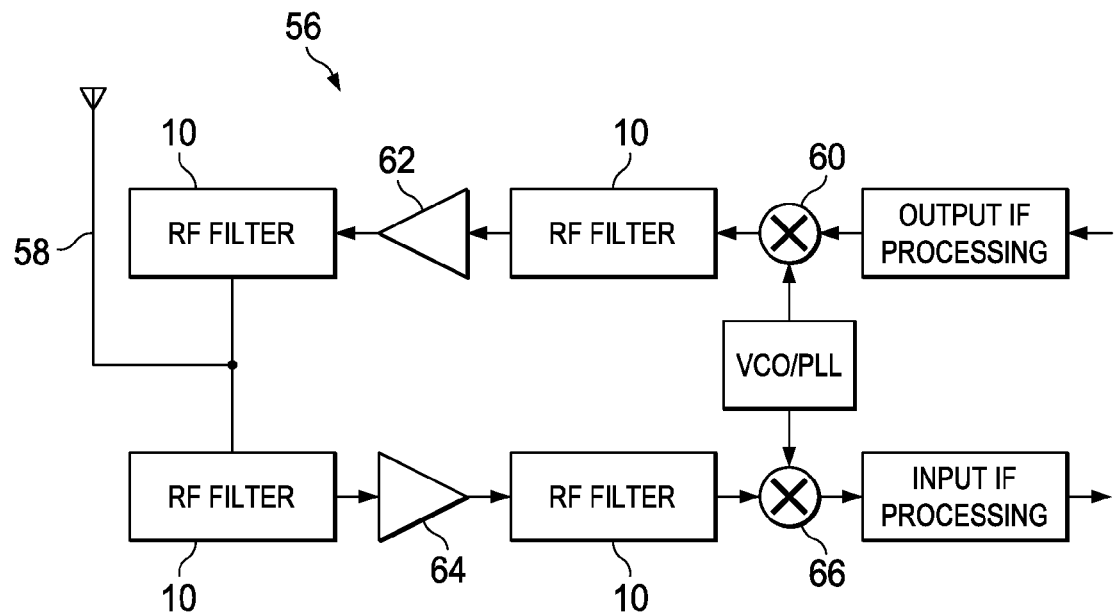
FIG. 9 is a simplified schematic of a wireless communications device (e.g., a base station) implementing the filter of FIG. 1.

Referring now to FIG. 9, a block diagram of an embodiment of a wireless communications device 56 (e.g., a base station) employing the filters 10 is illustrated. In FIG. 9, an antenna 58 is operably coupled to a front-end duplexer including one of the filters 10 in the transmit circuit and one of the filters in the receive circuit. Another one of the filters 10 is positioned in the transmit path between a mixer 60 and a power amplifier 62. An additional filter 10 is positioned in the receive path between low noise amplifier 64 and mixer 66. The arrangement of various components depicted in FIG. 9 may be different in other embodiments. In addition, other circuitry often found in a wireless communications device would be included in a practical device.

Figure 10:
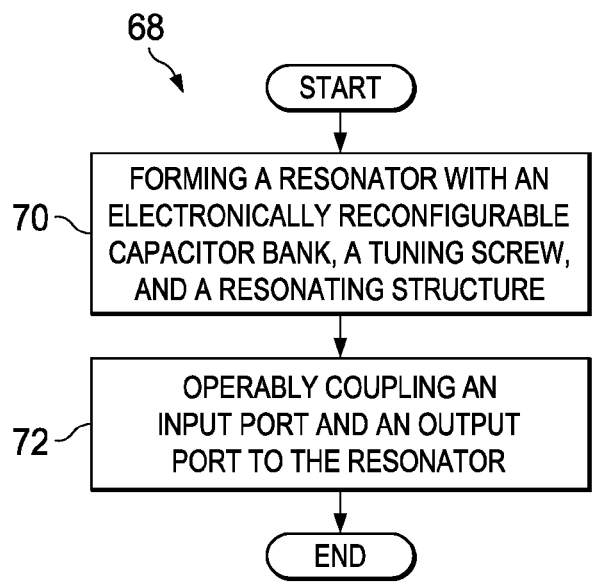
FIG. 10 is a flowchart illustrating an embodiment of a method of fabricating the filter of FIG. 1.

Referring now to FIG. 10, a method 68 of fabricating the filter 10 is illustrated. In block 70, a resonator 12 is formed with the electronically configurable capacitor bank 20, the tuning screw 22, and the resonating structure 24. In block 72, the input and output ports 16 are coupled to the resonator 12 to form the filter. In an embodiment, one or more additional resonators 12 may be coupled to the initially formed resonator 12 using the coupling structure 14.

The various embodiment filters 10 disclosed herein may decrease the volume occupied by cavity filters in base-stations. In addition, embodiment filters 10 may reduce the number of filter products implemented in a given base station system. In the alternative, the tunable filters 10 may be similar in size compared with prior art fixed frequency bandpass filters with similar performance specifications. Moreover, unlike traditional motor-based tunable filters, where frequency tuning is done by a motor mechanically driving tuning screws, the filter 10 employs electrically reconfigurable capacitor banks 20 and/or manually or mechanically adjusted tuning screws 22 to tune filter center frequency. In an embodiment, no mechanical movement of any part in the filter is needed during the tuning process.

Although embodiments described hereinabove operate within the specifications of a cellular communication network such as a 3GPP-LTE cellular network, other wireless communication arrangements are contemplated within the broad scope of an embodiment, including WiMAX, GSM, Wi-Fi, and other wireless communication systems, including different frequency, capacitance, and filter-type specifications.

It is noted that, unless indicated otherwise, functions described herein can be performed in either hardware or software, or some combination thereof, with or without human intervention. In an embodiment, the functions are performed by a processor such as a computer or an electronic data processor in accordance with code such as computer program code, software, and/or integrated circuits that are coded to perform such functions, unless indicated otherwise.

While the disclosure has been made with reference to illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A tunable bandpass filter, comprising:
 a tunable resonator including:
  a body having a bottom wall, a top wall and four side walls surrounding a cavity;
  a resonating structure in the cavity;
  an electrically reconfigurable capacitor bank including a printed circuit board and at least one capacitor mounted on the printed circuit board, wherein the printed circuit board is mounted outside of the cavity on the top wall of the body; and
  a tuning screw capacitively coupled to the resonating structure, wherein the tuning screw is threadably mounted to the printed circuit board, disposed through an unthreaded hole in a spacer mounted in the top wall of the body, and electrically coupled to the at least one capacitor on the printed circuit board, and wherein the tuning screw comprises a plate disposed in the cavity perpendicular to a screw axis of the tuning screw;
 an input operably coupled to the tunable resonator; and
 an output port operably coupled the tunable resonator.

2. The filter of claim 1, wherein the at least one capacitor is a fixed capacitor operably coupled to a switch.

3. The filter of claim 1, wherein the at least one capacitor is a variable capacitor operably coupled to a direct current (DC) bias circuit.

4. The filter of claim 1, wherein the at least one capacitor is a plurality of fixed capacitors and a plurality of respective switches.

5. The filter of claim 1, wherein the at least one capacitor is a plurality of variable capacitors and a plurality of respective DC bias circuits.

6. The filter of claim 1, wherein the plate is vertically disposed above an uppermost surface of the resonating structure to define a gap, and wherein the tuning screw is configured to be tuned to increase or decrease the gap.

7. The filter of claim 1, wherein the tunable resonator is operably coupled to at least one additional tunable resonator.

8. The filter of claim 1, wherein the tunable resonator is coupled to at least one additional tunable resonator through an iris coupling.

9. A tunable bandpass filter, comprising:
 a plurality of tunable resonators, wherein each tunable resonator includes:
  a body having a bottom wall, a top wall and four side walls surrounding a cavity;
  a resonating structure in the cavity;
  an electrically reconfigurable capacitor bank including a printed circuit board and at least one capacitor mounted on the printed circuit board, wherein the printed circuit board is mounted outside of the cavity on the top wall of the body; and
  a tuning screw capacitively coupled to the resonating structure, wherein the tuning screw is threadably mounted to the printed circuit board, disposed through an unthreaded hole in a spacer mounted in the top wall of the body, and electrically coupled to the at least one capacitor on the printed circuit board, and wherein the tuning screw comprises a plate disposed in the cavity perpendicular to a screw axis of the tuning screw;

a plurality of coupling structures operably coupling the tunable resonators; and an input port and an output port operably coupled to one or more of the plurality of the tunable resonators.

10. The filter of claim 9, wherein the at least one capacitor is a fixed capacitor operably coupled to a switch.

11. The filter of claim 9, wherein the at least one capacitor is a variable capacitor operably coupled to a direct current (DC) bias circuit.

12. The filter of claim 9, wherein each plate of the tuning screws is vertically disposed above each of the resonating structures to define a gap, and wherein each of the tuning screws is configured to be threadably driven to increase or decrease the gap.

13. A wireless communications device, comprising:
a duplexer operably coupled to an antenna;
an amplifier operably coupled to the duplexer; and
a tunable bandpass filter operably coupled to the duplexer and to the amplifier, the filter including a tunable resonator comprising:
a body having a bottom wall, a top wall and four side walls surrounding a cavity;
a resonating structure in the cavity;
an electrically reconfigurable capacitor bank including a printed circuit board and at least one capacitor mounted on the printed circuit board, wherein the printed circuit board is mounted outside of the cavity on the top wall of the body; and
a tuning screw capacitively coupled to the resonating structure, wherein the tuning screw is threadably mounted to the printed circuit board, disposed through an unthreaded hole in a spacer mounted in the top wall of the body, and electrically coupled to the at least one capacitor on the printed circuit board, and wherein the tuning screw comprises a plate disposed in the cavity perpendicular to a screw axis of the tuning screw.

14. The wireless communications device of claim 13, further comprising a mixer and an additional tunable resonator having an additional electrically reconfigurable capacitor bank.

15. The wireless communications device of claim 13, wherein the at least one capacitor is a fixed capacitor operably coupled to a switch.

16. The wireless communications device of claim 13, wherein the at least one capacitor is a variable capacitor operably coupled to a direct current (DC) bias circuit.

17. The wireless communications device of claim 13, wherein the at least one capacitor is a plurality of capacitors.

18. The wireless communications device of claim 13, wherein the tuning screw is at least one of manually and mechanically rotatable to adjust a capacitance of the filter.

19. A method of fabricating a tunable bandpass filter having a tunable resonator, the method comprising:
forming a resonator structure in a cavity of a body having a bottom wall, a top wall and four side walls surrounding the cavity;
mounting an electrically reconfigurable capacitor bank outside of the cavity on the top wall of the body, the electrically reconfigurable capacitor bank including a printed circuit board and at least one capacitor mounted on the printed circuit board;
threadably mounting a tuning screw to the printed circuit board, wherein the tuning screw is disposed through an unthreaded hole in a spacer mounted in the top wall of the body, wherein the tuning screw is capacitively coupled to the resonator structure, and wherein the tuning screw has a plate perpendicular to a screw axis of the tuning screw and in the cavity;
electrically coupling the tuning screw to the at least one capacitor on the printed circuit board; and
operably coupling an input port and an output port to the tuning resonator.

20. The method of claim 19, further comprising operably coupling the tunable resonator to an additional tunable resonator.

* * * * *